(12) United States Patent
Wang et al.

(10) Patent No.: US 12,045,120 B2
(45) Date of Patent: Jul. 23, 2024

(54) ERROR RATE ANALYSIS METHOD, SYSTEM AND APPARATUS FOR MLC CHIP

(71) Applicant: INSPUR SUZHOU INTELLIGENT TECHNOLOGY CO., LTD., Jiangsu (CN)

(72) Inventors: Min Wang, Jiangsu (CN); Chuang Zhang, Jiangsu (CN); Zhixin Ren, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/267,438

(22) PCT Filed: Dec. 30, 2021

(86) PCT No.: PCT/CN2021/142855
§ 371 (c)(1),
(2) Date: Jun. 14, 2023

(87) PCT Pub. No.: WO2023/024383
PCT Pub. Date: Mar. 2, 2023

(65) Prior Publication Data
US 2024/0045749 A1 Feb. 8, 2024

(30) Foreign Application Priority Data
Aug. 24, 2021 (CN) .......................... 202110971258.6

(51) Int. Cl.
G06F 11/00 (2006.01)
G06F 11/07 (2006.01)
(52) U.S. Cl.
CPC ................................. G06F 11/076 (2013.01)

(58) Field of Classification Search
CPC .............. G06F 11/076; G06F 11/0754; G06F 11/1072; G06F 11/1008; G11C 29/10; G11C 29/38
See application file for complete search history.

(56) References Cited

U.S. PATENT DOCUMENTS 9,159,423 B1    10/2015  Brahmadathan et al.
2011/0173378 A1*  7/2011  Filor .................... G11C 29/765
                                                711/E12.008

(Continued)

FOREIGN PATENT DOCUMENTS

CN    105427886 A    3/2016
CN    107395214 A   11/2017

(Continued)

OTHER PUBLICATIONS

Xiaoshan Yang. "Research on Program Disturb Error of NAND Flash Memory." Journal of Communication University of China (Natural Science Edition), 25(3). Jun. 30, 2018.

*Primary Examiner* — Marc Duncan
(74) *Attorney, Agent, or Firm* — IPro, PLLC (57) ABSTRACT

A method, system and device for analyzing an error rate of an MLC chip. The method includes selecting data blocks from the MLC chip, and performing erasing-writing operations to the data blocks; after the erasing-writing operations are completed, reading each of groups of the dual-bits corresponding to each of the first pages and the second pages of the data blocks, and determining the bit state of the each of groups of the dual-bits; counting up the first total quantity of all of the dual-bits corresponding to the target page in the target bit state representing that the data writing is erroneous, to obtain a first error rate of the target page in the target bit state; and counting up a second total quantity of all of the dual-bits corresponding to the data blocks in the target bit state.

20 Claims, 2 Drawing Sheets

(56) References Cited

U.S. PATENT DOCUMENTS

2015/0067415 A1* 3/2015 Miyamoto ............ G06F 11/073
　　　　　　　　　　　　　　　　　　714/704
2016/0077903 A1* 3/2016 Reddy ................. G06F 11/0727
　　　　　　　　　　　　　　　　　　714/704

FOREIGN PATENT DOCUMENTS

| CN | 111276179 A | 6/2020 |
| CN | 113419688 A | 9/2021 |

* cited by examiner

| | |
|---|---|
| selecting data blocks of a preset quantity from the MLC chip, and performing erasing-writing operations of a preset time quantity to the data blocks, wherein, in the data blocks, data written into a first page that is for storing a higher bit of a dual-bit are the same, and data written into a second page that is for storing a lower bit of the dual-bit are the same | Step S1 |
| after the erasing-writing operations are completed, reading each of groups of the dual-bits corresponding to each of the first pages and the second pages of the data blocks, and determining a bit state of the each of groups of the dual-bits, wherein the bit state includes one first bit state that represents that data writing is correct and three second bit states that represent that the data writing is erroneous | Step S2 |
| counting up a first total quantity of all of the dual-bits corresponding to a target page in a target bit state, and dividing the first total quantity by a total quantity of the dual-bits corresponding to the target page, to obtain a first error rate of the target page in the target bit state, wherein the target page is any one of the first pages or any one of the second pages, and the target bit state is any one of the second bit states | Step S3 |
| counting up a second total quantity of all of the dual-bits corresponding to the data blocks in the target bit state, and dividing the second total quantity by a total quantity of the dual-bits corresponding to the data blocks, to obtain a second error rate of the data blocks in the target bit state, to analyze a performance of the MLC chip based on the first error rate and the second error rate | Step S4 |

ERROR RATE ANALYSIS METHOD, SYSTEM AND APPARATUS FOR MLC CHIP

CROSS REFERENCE TO RELEVANT APPLICATIONS

The present disclosure claims the priority of the Chinese patent application filed on Aug. 24, 2021 before the Chinese Patent Office with the application number of 202110971258.6 and the title of "ERROR RATE ANALYSIS METHOD, SYSTEM AND APPARATUS FOR MLC CHIP", which is incorporated herein in its entirety by reference.

TECHNICAL FIELD

The present disclosure relates to the field of storage and, more particularly, to a method, for analyzing an error rate of an MLC chip a system and a device.

BACKGROUND

Currently, NAND Flash (non-volatile flash memories) are being used very extensively, and are suitable for various storage scenes. The NAND Flash, in terms of its architecture, is divided into a single-level cell (SLC, which refers to that 1 storage unit may store the datum of 1 bit, which has two situations of 0 and 1), a multi-level cell (MLC, which refers to that 1 storage unit may store the datum of 2 bits, which has four situations of 11, 10, 01 and 00) and a triple-level cell (TLC, which refers to that 1 storage unit may store the datum of 3 bits, which has 8 situations of 000, 001, 010, 011, 100, 101, 110 and 111. The MLC chip is currently the mainstream storage chip. The performance of the MLC chip mainly depends on the error rate of the data writing of the MLC chip (it may be understood that, if the error rate of the data writing of the MLC chip is higher, the performance of the MLC chip is generally poorer).

SUMMARY

The present disclosure provides a method for analyzing an error rate of an MLC chip, wherein the method includes:

selecting data blocks of a preset quantity from the MLC chip, and performing erasing-writing operations of a preset time quantity to the data blocks, wherein, in the data blocks, data written into a first page that is for storing a higher bit of a dual-bit are the same, and data written into a second page that is for storing a lower bit of the dual-bit are the same;

after the erasing-writing operations are completed, reading each of groups of the dual-bits corresponding to each of the first pages and the second pages of the data blocks, and determining a bit state of the each of groups of the dual-bits, wherein the bit state includes one first bit state that represents that data writing is correct and three second bit states that represent that the data writing is erroneous;

counting up a first total quantity of all of the dual-bits corresponding to a target page in a target bit state, and dividing the first total quantity by a total quantity of the dual-bits corresponding to the target page, to obtain a first error rate of the target page in the target bit state, wherein the target page is any one of the first pages or any one of the second pages, and the target bit state is any one of the second bit states; and counting up a second total quantity of all of the dual-bits corresponding to the data blocks in the target bit state, and dividing the second total quantity by a total quantity of the dual-bits corresponding to the data blocks, to obtain a second error rate of the data blocks in the target bit state, to analyze a performance of the MLC chip based on the first error rate and the second error rate.

In one of the embodiments, simultaneously with the step of counting up the first total quantity of all of the dual-bits corresponding to the target page in the target bit state, the method for analyzing the error rate of the MLC chip further includes:

counting up a third total quantity of all of the dual-bits corresponding to the target page in the first bit state, and dividing the third total quantity by the total quantity of the dual-bits corresponding to the target page, to obtain a first correction rate of the target page in the first bit state.

In one of the embodiments, simultaneously with the step of counting up the second total quantity of all of the dual-bits corresponding to the data blocks in the target bit state, the method for analyzing the error rate of the MLC chip further includes:

counting up a fourth total quantity of all of the dual-bits corresponding to the data blocks in the first bit state, and dividing the fourth total quantity by the total quantity of the dual-bits corresponding to the data blocks, to obtain a second correction rate of the data blocks in the first bit state.

In one of the embodiments, the step of selecting the data blocks of the preset quantity from the MLC chip includes:

numbering the data blocks of the MLC chip sequentially according to a storing sequence; and selecting fault-free data blocks from the data blocks, and selecting, from the fault-free data blocks, data blocks of odd-number numbers and data blocks of even-number numbers of equal quantities to be used as data blocks for analyzing the error rate.

In one of the embodiments, the step of performing the erasing-writing operations of the preset time quantity to the data blocks includes:

performing a data erasing operation to the data blocks, wherein all of states of all of pages in the data blocks after the erasing are 11;

performing a data writing operation to the data blocks, wherein all of bit data written into the first pages of the data blocks are 1, and all of bit data written into the second pages are 0; and after the data writing operation is completed, returning to execute the step of performing the data erasing operation to the data blocks, till a total time quantity of the erasing-writing operations of the data blocks reaches the preset time quantity.

In one of the embodiments, the step of counting up the first total quantity of all of the dual-bits corresponding to the target page in the target bit state includes:

according to $$pageL_{2j} = \sum_{t1=1}^{total\ page\ bit\ quantity} L_{2j}^{t1},$$

counting up the first total quantity of all of the dual-bits corresponding to the target page in the target bit state, wherein the bit state includes the three second bit states $L_0$, $L_1$ and $L_3$ and the first bit state $L_2$; $L_{2j}=1$ represents that the bit state changes from $L_2$ into $L_j$, $L_{2j}=0$ represents that the bit state does not change from $L_2$ into $L_j$, and $j=0, 1$, and $3$; $L_{2j}^{t1}$ represents a numerical value of $L_{2j}$ corresponding to a t1-th dual-bit corresponding to the target page, wherein a maximum value of t1 is a total quantity of the dual-bits corresponding to the target page; and pageL$_{2j}$ is a first total quantity of all of the dual-bits corresponding to the target page in the bit state L$_j$.

In one of the embodiments, the step of counting up the second total quantity of all of the dual-bits corresponding to the data blocks in the target bit state includes:

according to $$blockL_{2j} = \sum_{t2=1}^{\text{first or second total page quantity}} pageL_{2j}^{t2},$$

counting up the second total quantity of all of the dual-bits corresponding to the data blocks in the target bit state;

wherein pageL$_{2j}^{t2}$ represents a first total quantity corresponding to a t2-th first page or second page of the data blocks, wherein a maximum value of t2 is a total quantity of the first pages or a total quantity of the second pages of the data blocks; and blockL$_{2j}$ is a second total quantity of all of the dual-bits corresponding to the data blocks in the bit state L$_j$.

In one of the embodiments, that in the data blocks, data written into a first page that is for storing a higher bit of a dual-bit are the same, and data written into a second page that is for storing a lower bit of the dual-bit are the same includes:

each of the data blocks includes 2*N pages, the 2*N pages are divided into N pairs of pages, and each of the pairs of pages includes the first page for storing the higher bit of the dual-bit and the second page for storing the lower bit of the dual-bit; the data written into all of the first pages of the data blocks are the same, and the data written into all of the second pages are the same; and N is an integer greater than 1.

The present disclosure further provides a system for analyzing an error rate of an MLC chip, wherein the system includes:

an erasing-writing module configured for selecting data blocks of a preset quantity from the MLC chip, and performing erasing-writing operations of a preset time quantity to the data blocks, wherein, in the data blocks, data written into a first page that is for storing a higher bit of a dual-bit are the same, and data written into a second page that is for storing a lower bit of the dual-bit are the same;

a state determining module configured for, after the erasing-writing operations are completed, reading each of groups of the dual-bits corresponding to each of the first pages and the second pages of the data blocks, and determining a bit state of the each of groups of the dual-bits, wherein the bit state includes one first bit state that represents that data writing is correct and three second bit states that represent that the data writing is erroneous;

a page counting-up module configured for counting up a first total quantity of all of the dual-bits corresponding to a target page in a target bit state, and dividing the first total quantity by a total quantity of the dual-bits corresponding to the target page, to obtain a first error rate of the target page in the target bit state, wherein the target page is any one of the first pages or any one of the second pages, and the target bit state is any one of the second bit states; and a data-block counting-up module configured for counting up a second total quantity of all of the dual-bits corresponding to the data blocks in the target bit state, and dividing the second total quantity by a total quantity of the dual-bits corresponding to the data blocks, to obtain a second error rate of the data blocks in the target bit state, to analyze a performance of the MLC chip based on the first error rate and the second error rate.

In one of the embodiments, the page counting-up module is further configured for:

simultaneously with the step of counting up the first total quantity of all of the dual-bits corresponding to the target page in the target bit state, counting up a third total quantity of all of the dual-bits corresponding to the target page in the first bit state, and dividing the third total quantity by the total quantity of the dual-bits corresponding to the target page, to obtain a first correction rate of the target page in the first bit state; and the data-block counting-up module is further configured for:

simultaneously with the step of counting up the second total quantity of all of the dual-bits corresponding to the data blocks in the target bit state, counting up a fourth total quantity of all of the dual-bits corresponding to the data blocks in the first bit state, and dividing the fourth total quantity by the total quantity of the dual-bits corresponding to the data blocks, to obtain a second correction rate of the data blocks in the first bit state.

The present disclosure further provides a device for analyzing an error rate of an MLC chip, wherein the device includes a memory and one or more processors, and the memory stores a computer-readable instruction, and the computer-readable instruction, when executed by the one or more processors, causes the one or more processors to implement the steps of the method for analyzing the error rate of the MLC chip according to any one of the above embodiments.

An embodiment of the present disclosure finally provides one or more non-volatile computer-readable storage mediums storing a computer-readable instruction, wherein the computer-readable instruction, when executed by one or more processors, causes the one or more processors to implement the steps of the method for analyzing the error rate of the MLC chip according to any one of the above embodiments.

The details of one or more embodiments of the present disclosure are provided in the following drawings and description. The other characteristics and advantages of the present disclosure may become apparent from the description, the drawings and the claims.

BRIEF DESCRIPTION OF THE DRAWINGS

In order to more clearly illustrate the technical solutions of the embodiments of the present disclosure, the figures that are required to describe the prior art and the embodiments may be briefly described below. Apparently, the figures that are described below are merely embodiments of the present disclosure, and a person skilled in the art may obtain other figures according to these figures without paying creative work.

DETAILED DESCRIPTION

The inventor has envisaged that, in the prior art, the error rate of the data writing of the MLC chip is usually calculated by using the single-bit global analysis method. The principle of the single-bit global analysis method is as follows: if, when the MLC chip is written with data, the written bit data vary from 0 to 1 or from 1 to 0, then it is considered that the bit data have an error, and the total quantity of the erroneous bits is accumulated by one. Therefore, if it is set that the total quantity of the erroneous bits is M, and the total quantity of the bits that participate in the error analysis of the bit data is N, then, for the entire MLC chip, the bit error ratio (BER) of the data writing of the chip=M/N. However, the single-bit global analysis method cannot perform analysis on the error rates of the data blocks and pages of the MLC chip, which is adverse to complete analysis on the performance of the MLC chip.

The core of the present disclosure is to provide a method for analyzing an error rate of an MLC chip, a system and a device, which may perform analysis on the error rate to the data blocks and pages of the MLC chip, and may analyze the error rates of the data blocks and pages in different bit states, which facilitates to completely analyze the performance of the MLC chip.

In order to make the objects, the technical solutions and the advantages of the embodiments of the present disclosure clearer, the technical solutions according to the embodiments of the present disclosure may be clearly and completely described below with reference to the drawings according to the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
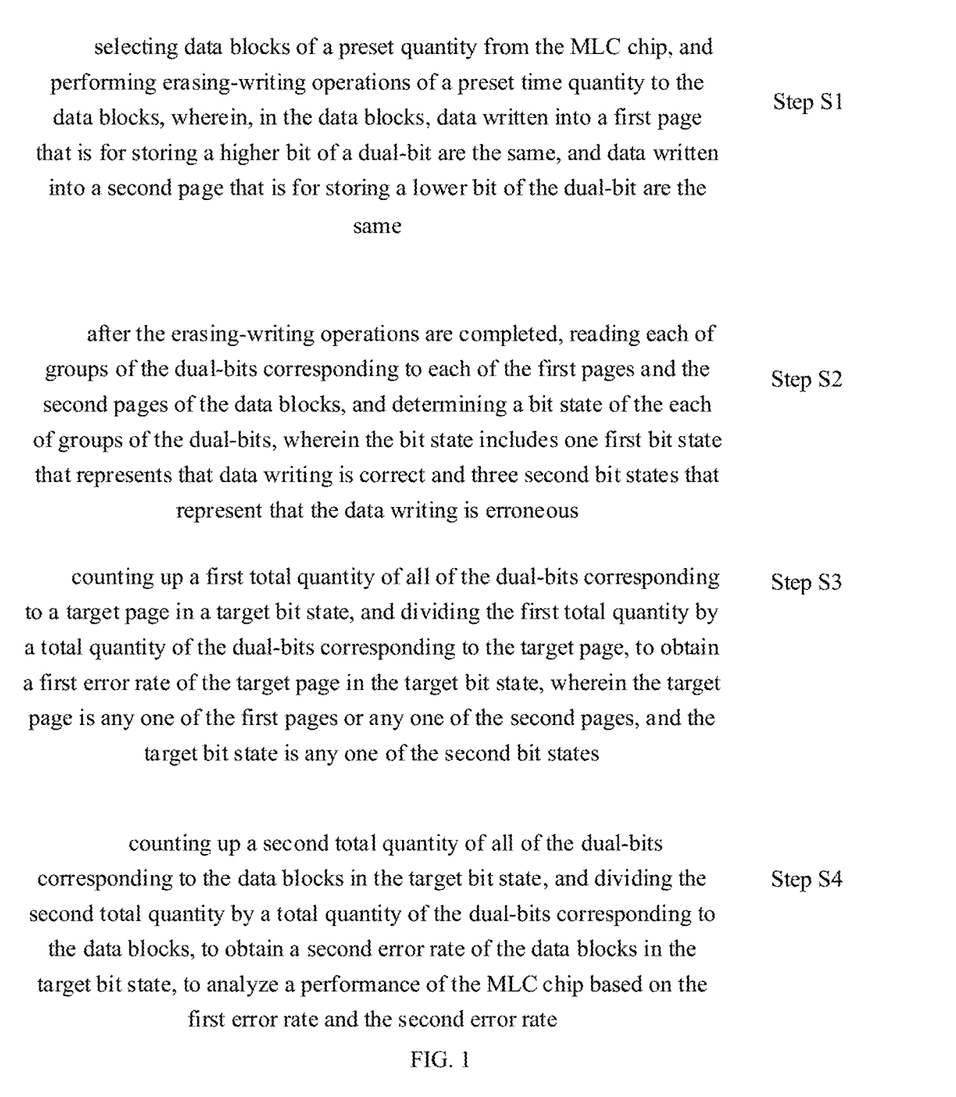
FIG. 1 is a flow chart of a method for analyzing an error rate of an MLC chip according to one or more embodiments of the present disclosure.

Referring to FIG. 1, FIG. 1 is a flow chart of a method for analyzing an error rate of an MLC chip according to an embodiment of the present disclosure.

The method for analyzing an error rate of an MLC chip includes:

Step S1: selecting data blocks of a preset quantity from the MLC chip, and performing erasing-writing operations of a preset time quantity to the data blocks, wherein in the data blocks, data written into a first page that is for storing a higher bit of a dual-bit are the same, and data written into a second page that is for storing a lower bit of the dual-bit are the same.

The MLC chip includes a plurality of data blocks (the smallest unit of the erasing operation), and each of the data blocks includes a plurality of pages (the smallest unit of the writing operation). For the MLC chip, two bits serve as one unit, which is referred to as a dual-bit. The dual-bit include a most significant bit (MSB) bit and a least significant bit (LSB) bit. If the originally written-in content is MN, then the MSB bit (i.e., the higher bit) is M, and the LSB bit (i.e., the lower bit) is N. It should be noted that the higher bit and the lower bit of the dual-bit are mapped to different pages. In other words, each of the data blocks includes pages of two major types, which are referred to as a first page (upper page) and a second page (lower page), wherein the first page is configured for storing the higher bit of the dual-bit, and the second page is configured for storing the lower bit of the dual-bit. In other words, the first page and the second page are a pair of pages, and merely the higher bit in the first page and the lower bit in the second page corresponding to the higher bit may form a complete dual-bit.

Based on that, in the present disclosure, firstly the data blocks of a preset quantity are selected from the MLC chip (for example, accounting for 20% of the total quantity of the data blocks of the chip. Usually all of the data blocks are not selected, because that results in enormous data, which is inconvenient for the analysis on the error rate), and subsequently those selected data blocks undergo pressure test, i.e., performing erasing-writing operations of the preset time quantity to those selected data blocks, to prepare for the subsequent analysis on the error rates of the data blocks and pages of the MLC chip. It should be noted that the data written into the plurality of first pages of the data blocks are the same, and the data written into the plurality of second pages of the data blocks are the same.

Step S2: after the erasing-writing operations are completed, reading each of groups of the dual-bits corresponding to each of the first pages and the second pages of the data blocks, and determining a bit state of the each of groups of the dual-bits, wherein the bit state includes one first bit state that represents that data writing is correct and three second bit states that represent that the data writing is erroneous.

In the present disclosure, after the erasing-writing operations of the preset time quantity performed to the selected data blocks are completed, any one of the selected data blocks undergoes the following operations (taking a first data block as an example for the description): reading each of groups of the dual-bits corresponding to each of the first pages and the second pages of the first data block (reading the higher bit of a dual-bit from the first page of the first data block, and reading the lower bit of the dual-bit from the second page of the first data block, wherein the data may be placed into a buffer to be used for the subsequent analysis), and determining the bit state of the each of groups of the dual-bits (there are four cases: 11, 10, 01 and 00), to be used for the subsequent analysis on the error rates of the data blocks and pages of the MLC chip.

For example, it may be understood that, if originally one group of the dual-bits 10 is written into the first page and the second page of the first data block, then the bit state of that group of the dual-bits read from the first page and the second page of the first data block should be 10. If the bit state of that group of the dual-bits read from the first page and the second page of the first data block is 11 or 01 or 00, which indicates that that group of the dual-bits has a writing error. In other words, the bit states of all of the dual-bits of the first data block have four situations, i.e., one bit state that represents that the data writing is correct (referred to as the first bit state) and three bit states that represent that the data writing is erroneous (referred to as the second bit states).

Step S3: counting up a first total quantity of all of the dual-bits corresponding to a target page in a target bit state, and dividing the first total quantity by a total quantity of the dual-bits corresponding to the target page, to obtain a first error rate of the target page in the target bit state, wherein the target page is any one of the first pages or any one of the second pages, and the target bit state is any one of the second bit states.

Taking a target page (which refers to any one of the first pages or any one of the second pages, wherein the quantities of the first pages and the second pages in the same one data block are equal) as an example, in the present disclosure, the first total quantity of all of the dual-bits corresponding to the target page in the target bit state (which refers to any one of the second bit states) is counted up, and subsequently the first total quantity corresponding to the target page in the target bit state is divided by the total quantity of the dual-bits corresponding to the target page, whereby the error rate of the target page in the target bit state (which is referred to as the first error rate) may be obtained, thereby obtaining the first error rates of the target page in the three second bit states.

Step S4: counting up a second total quantity of all of the dual-bits corresponding to the data blocks in the target bit state, and dividing the second total quantity by a total quantity of the dual-bits corresponding to the data blocks, to obtain a second error rate of the data blocks in the target bit state, to analyze a performance of the MLC chip based on the first error rate and the second error rate.

Taking the first data block as an example for the description (the other data blocks are in the same manner), in the present disclosure, the second total quantity of all of the dual-bits corresponding to the first data block in the target bit state (which refers to any one of the second bit states) is counted up, and subsequently the second total quantity corresponding to the first data block in the target bit state is divided by the total quantity of the dual-bits corresponding to the first data block, whereby the error rate of the first data block in the target bit state (which is referred to as the second error rate) may be obtained, thereby obtaining the second error rates of the first data block in the three second bit states, to realize completely analyzing the performance of the MLC chip based on the first error rates corresponding to the pages of the data blocks and the second error rates corresponding to the data blocks.

The present disclosure provides a method for analyzing an error rate of an MLC chip, wherein the method includes: selecting data blocks of a preset quantity from the MLC chip, and performing erasing-writing operations of a preset time quantity to the data blocks; after the erasing-writing operations are completed, reading each of groups of the dual-bits corresponding to each of the first pages and the second pages of the data blocks, and determining the bit state of the each of groups of the dual-bits; counting up the first total quantity of all of the dual-bits corresponding to the target page in the target bit state representing that the data writing is erroneous, and dividing the first total quantity by the total quantity of the dual-bits corresponding to the target page, to obtain a first error rate of the target page in the target bit state; and counting up a second total quantity of all of the dual-bits corresponding to the data blocks in the target bit state, and dividing the second total quantity by the total quantity of the dual-bits corresponding to the data blocks, to obtain a second error rate of the data blocks in the target bit state, to analyze the performance of the MLC chip based on the first error rate and the second error rate. It may be seen that the present disclosure may perform analysis on the error rate to the data blocks and pages of the MLC chip, and may analyze the error rates of the data blocks and pages in different bit states, which facilitates to completely analyze the performance of the MLC chip.

On the basis of the above embodiments:

As an alternative embodiment, simultaneously with the step of counting up the first total quantity of all of the dual-bits corresponding to the target page in the target bit state, the method for analyzing the error rate of the MLC chip further includes:

counting up a third total quantity of all of the dual-bits corresponding to the target page in the first bit state, and dividing the third total quantity by the total quantity of the dual-bits corresponding to the target page, to obtain a first correction rate of the target page in the first bit state.

In the present disclosure, simultaneously with the step of counting up the first total quantity of all of the dual-bits corresponding to the target page in the target bit state, the method further includes counting up a third total quantity of all of the dual-bits corresponding to the target page in the first bit state, and dividing the third total quantity corresponding to the target page in the first bit state by the total quantity of the dual-bits corresponding to the target page, to obtain the correction rate of the target page in the first bit state (which is referred to as the first correction rate).

As an alternative embodiment, simultaneously with the step of counting up the second total quantity of all of the dual-bits corresponding to the data blocks in the target bit state, the method for analyzing the error rate of the MLC chip further includes:

counting up a fourth total quantity of all of the dual-bits corresponding to the data blocks in the first bit state, and dividing the fourth total quantity by the total quantity of the dual-bits corresponding to the data blocks, to obtain a second correction rate of the data blocks in the first bit state.

Taking the first data block as an example for the description (the other data blocks are in the same manner), in the present disclosure, simultaneously with the step of counting up the second total quantity of all of the dual-bits corresponding to the first data block in the target bit state, the method further includes counting up a fourth total quantity of all of the dual-bits corresponding to the first data block in the first bit state, and dividing the fourth total quantity corresponding to the first data block in the first bit state by the total quantity of the dual-bits corresponding to the first data block, to obtain the correction rate of the first data block in the first bit state (which is referred to as the second correction rate).

It may be understood that, if the correction rates of the data blocks of the MLC chip in the first bit state are higher, and the correction rates of the pages of the data blocks in the first bit state are higher, the performance of the MLC chip is better.

As an alternative embodiment, the step of selecting the data blocks of the preset quantity from the MLC chip includes:

numbering the data blocks of the MLC chip sequentially according to a storing sequence; and selecting fault-free data blocks from the data blocks, and selecting, from the fault-free data blocks, data blocks of odd-number numbers and data blocks of even-number numbers of equal quantities to be used as data blocks for analyzing the error rate.

The present disclosure may include, when selecting the data blocks of the preset quantity from the MLC chip, firstly numbering the data blocks of the MLC chip sequentially according to the storing sequence (1, 2, 3, 4 . . . ), and subsequently selecting the data blocks by following three conditions: 1) the total quantity of the selected data blocks is equal to a preset quantity; 2) the selected data blocks are good blocks (i.e., fault-free data blocks), because bad blocks have a higher error rate themselves, which results in erroneous determination; and 3) the quantities of the selected data blocks of odd-number numbers and the selected data blocks of even-number numbers are equal, because the error distributions of the data blocks of odd-number numbers and the data blocks of even-number numbers are different, and therefore it should be ensured that the data blocks of odd-number numbers and of even-number numbers are evenly distributed. Accordingly, in the present disclosure, the fault-free data blocks are selected from the data blocks of the MLC chip, and, from the fault-free data blocks, data blocks of odd-number numbers and data blocks of even-number numbers of equal quantities are selected to be used as the data blocks for analyzing the error rate.

As an alternative embodiment, the step of performing the erasing-writing operations of the preset time quantity to the data blocks includes:

performing a data erasing operation to the data blocks, wherein all of states of all of pages in the data blocks after the erasing are 11;

performing a data writing operation to the data blocks, wherein all of bit data written into the first pages of the data blocks are 1, and all of bit data written into the second pages are 0; and after the data writing operation is completed, returning to execute the step of performing the data erasing operation to the data blocks, till a total time quantity of the erasing-writing operations of the data blocks reaches the preset time quantity.

Taking the first data block as an example for the description (the other data blocks are in the same manner), in the present disclosure, the process of the pressure test on the first data block includes (referring to Table 1): 1) performing a data erasing operation to the first data block, wherein all of the states of all of the pages in the first data block after the erasing are 11; 2) performing a data writing operation to the first data block, wherein all of the bit data written into the first pages of the first data block are 1, and all of the bit data written into the second pages are 0, or, in other words, the data written into all of the dual-bits corresponding to the first data block are 10; and 3) repeating the data erasing operation and the data writing operation of the step 1) and the step 2), till the total time quantity of the erasing-writing operations of the first data block reaches the preset time quantity.

TABLE 1

| MSB&LSB | state |
| --- | --- |
| 11 | erasing state |
| 10 | LSB is written |
| 00 | both of LSB and MSB are written |
| 01 | MSB is written |

Figure 2:
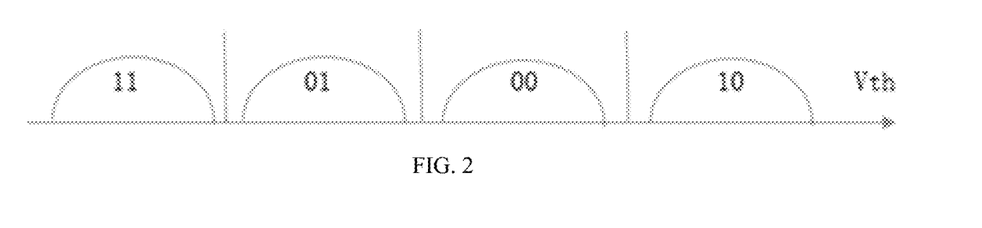
FIG. 2 is a schematic diagram of the voltage distribution in different bit states of the dual-bits according to one or more embodiments of the present disclosure.

It should be noted that, when the pages of the data blocks are written with the data, the voltage of the storage circuit corresponding to the data blocks varies. As shown in FIG. 2, the situation of the voltage distributions of the dual-bits in different bit states is: the voltage corresponding to the bit state 11<the voltage corresponding to the bit state 01<the voltage corresponding to the bit state 00<the voltage corresponding to the bit state 10. The reason for selecting the variation from 11 to 10 in the pressure test is to ensure that the voltage has a maximum jumping, at which point the pressure is the highest and the loss is the highest, whereby the pressure test is more effective.

As an alternative embodiment, the step of counting up the first total quantity of all of the dual-bits corresponding to the target page in the target bit state includes:

according to $$pageL_{2j} = \sum_{t1=1}^{total\ page\ bit\ quantity} L_{2j}^{t1},$$

counting up the first total quantity of all of the dual-bits corresponding to the target page in the target bit state, wherein the bit state includes the three second bit states $L_0$, $L_1$ and $L_3$ and the first bit state $L_2$; $L_{2j}=1$ represents that the bit state changes from $L_2$ into $L_j$, $L_{2j}=0$ represents that the bit state does not change from $L_2$ into $L_j$, and j=0, 1, and 3; $L_{2j}^{t1}$ represents a numerical value of $L_{2j}$ corresponding to a t1-th dual-bit corresponding to the target page, wherein a maximum value of t1 is a total quantity of the dual-bits corresponding to the target page; and $pageL_{2j}$ is a first total quantity of all of the dual-bits corresponding to the target page in the bit state $L_j$.

The bit states of the dual-bits have four situations: one first bit state that represents that the data writing is correct (represented by $L_2$) and three second bit states that represent that the data writing is erroneous (represented by $L_0$, $L_1$ and $L_3$). In other words, the bit state of the dual-bit originally written into the data block is $L_2$. If the bit state of the dual-bit read from the data block is $L_2$, that indicates that the data do not have an error, and accordingly that the data do not have an error has one situation that: the bit state of the dual-bit is always $L_2$ (which situation is represented by $L_{22}$). If the bit state of the dual-bit read from the data block is $L_0$, $L_1$ and $L_3$, that indicates that the data have an error, and accordingly that the data have an error has three situations that: 1) the bit state of the dual-bit changes from $L_2$ into $L_0$ (which situation is represented by $L_{20}$); 2) the bit state of the dual-bit changes from $L_2$ into $L_1$ (which situation is represented by $L_2$); and 3) the bit state of the dual-bit changes from $L_2$ into $L_3$ (which situation is represented by $L_{23}$).

Based on that, in the present disclosure, the relation for counting up the first total quantity of all of the dual-bits corresponding to the target page in the target bit state (which refers to any one of the second bit states) is:

$$pageL_{2j} = \sum_{t1=1}^{total\ page\ bit\ quantity} L_{2j}^{t1},$$

wherein $L_{2j}=1$ represents that the bit state changes from $L_2$ into $L_j$, $L_{2j}=0$ represents that the bit state does not change from $L_2$ into $L_j$, and j=0, 1, and 3; $L_{2j}^{t1}$ represents a numerical value of $L_{2j}$ corresponding to a t1-th dual-bit corresponding to the target page, wherein a maximum value of t1 is a total quantity of the dual-bits corresponding to the target page (the total page bit quantity); and $pageL_{2j}$ is a first total quantity of all of the dual-bits corresponding to the target page in the bit state $L_j$.

As an alternative embodiment, the step of counting up the second total quantity of all of the dual-bits corresponding to the data blocks in the target bit state includes:

according to $$blockL_{2j} = \sum_{t2=1}^{first\ or\ second\ total\ page\ quantity} pageL_{2j}^{t2},$$

counting up the second total quantity of all of the dual-bits corresponding to the data blocks in the target bit state;
wherein $pageL_{2j}^{t2}$ represents a first total quantity corresponding to a t2-th first page or second page of the data blocks, wherein a maximum value of t2 is a total quantity of the first pages or a total quantity of the second pages of the data blocks; and $blockL_{2j}$ is a second total quantity of all of the dual-bits corresponding to the data blocks in the bit state $L_j$.

In the present disclosure, the relation for counting up the second total quantity of all of the dual-bits corresponding to the data block in the target bit state (which refers to any one of the first or second total page quantity second bit states) is:

$$blockL_{2j} = \sum_{t2=1}^{\text{first or second total page quantity}} pageL_{2j}^{t2},$$

wherein $pageL_{2j}^{t2}$ represents a first total quantity corresponding to a t2-th first page or second page of the data blocks, wherein a maximum value of t2 is a total quantity of the first pages or a total quantity of the second pages of the data blocks (the first or second total page quantity); and $blockL_{2j}$ is a second total quantity of all of the dual-bits corresponding to the data blocks in the bit state $L_j$.

In addition, the present disclosure may include formulating a table based on the total quantities of all of the dual-bits corresponding to the data blocks of the MLC chip in the bit states, and formulating another table based on the total quantities of all of the dual-bits corresponding to the pages of the data blocks in the bit states, the purpose of which is to clearly count up the rule of the conversion of the bit states.

For example, taking L06B NAND (a non-volatile flash-memory chip) as an example for the analysis, the chip has 512 blocks, and each of the blocks has 256 pages. 40 blocks are selected for the testing, among which 20 are odd-number blocks and 20 are even-number blocks, and it is ensured that the selected blocks are good blocks. A pressure test of 1000 times of erasing is performed, and the content is $L_2=10$ (the second pages are written with 0 and the first pages are written with 1).

The data are read, analyzed and counted up, and the finally obtained result is in the following Table 2 (taking page 17 and page 20 as an example):

TABLE 2

|  | $L_{20}$ | $L_{21}$ | $L_{22}$ | $L_{23}$ |
| --- | --- | --- | --- | --- |
| Page 17 | 25 | 30 | 16312 | 17 |
| Page 20 | 41 | 22 | 16291 | 30 |

The rule of the variation of the bit state may be seen very clearly. By a percentage processing, the result in the following Table 3 is obtained:

TABLE 3

|  | $L_{20}$ | $L_{21}$ | $L_{22}$ | $L_{23}$ |
| --- | --- | --- | --- | --- |
| Page 17 | 0.15% | 0.18% | 99.5% | 0.1% |
| Page 20 | 0.25% | 0.13% | 99.4% | 0.18% |

Figure 3:
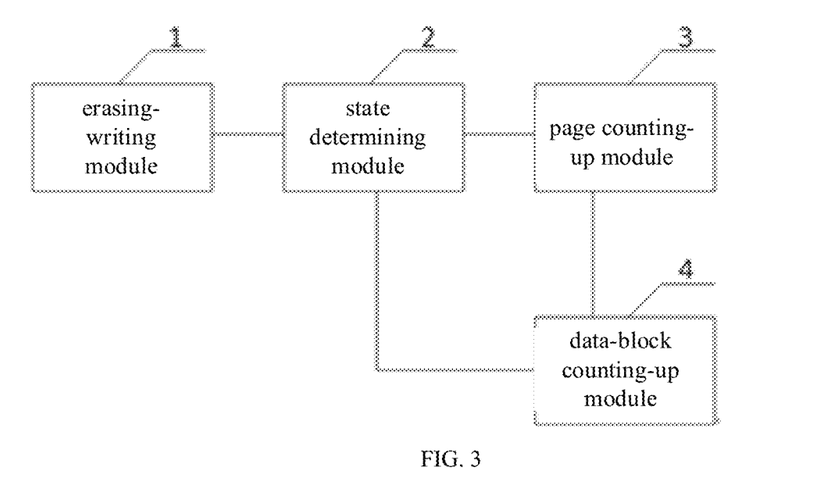
FIG. 3 is a schematic structural diagram of a system for analyzing an error rate of an MLC chip according to one or more embodiments of the present disclosure.

Referring to FIG. 3, FIG. 3 is a schematic structural diagram of a system for analyzing an error rate of an MLC chip according to an embodiment of the present disclosure.

The system for analyzing the error rate of the MLC chip includes:

an erasing-writing module 1 configured for selecting data blocks of a preset quantity from the MLC chip, and performing erasing-writing operations of a preset time quantity to the data blocks, wherein, in the data blocks, data written into a first page that is for storing a higher bit of a dual-bit are the same, and data written into a second page that is for storing a lower bit of the dual-bit are the same;

a state determining module 2 configured for, after the erasing-writing operations are completed, reading each of groups of the dual-bits corresponding to each of the first pages and the second pages of the data blocks, and determining a bit state of the each of groups of the dual-bits, wherein the bit state includes one first bit state that represents that data writing is correct and three second bit states that represent that the data writing is erroneous;

a page counting-up module 3 configured for counting up a first total quantity of all of the dual-bits corresponding to a target page in a target bit state, and dividing the first total quantity by a total quantity of the dual-bits corresponding to the target page, to obtain a first error rate of the target page in the target bit state, wherein the target page is any one of the first pages or any one of the second pages, and the target bit state is any one of the second bit states; and a data-block counting-up module 4 configured for counting up a second total quantity of all of the dual-bits corresponding to the data blocks in the target bit state, and dividing the second total quantity by a total quantity of the dual-bits corresponding to the data blocks, to obtain a second error rate of the data blocks in the target bit state, to analyze a performance of the MLC chip based on the first error rate and the second error rate.

As an alternative embodiment, the page counting-up module 3 is further configured for:

simultaneously with the step of counting up the first total quantity of all of the dual-bits corresponding to the target page in the target bit state, counting up a third total quantity of all of the dual-bits corresponding to the target page in the first bit state, and dividing the third total quantity by the total quantity of the dual-bits corresponding to the target page, to obtain a first correction rate of the target page in the first bit state; and the data-block counting-up module 4 is further configured for:

simultaneously with the step of counting up the second total quantity of all of the dual-bits corresponding to the data blocks in the target bit state, counting up a fourth total quantity of all of the dual-bits corresponding to the data blocks in the first bit state, and dividing the fourth total quantity by the total quantity of the dual-bits corresponding to the data blocks, to obtain a second correction rate of the data blocks in the first bit state.

The description on the system for analyzing the error rate of the MLC chip according to the present disclosure may refer to the above embodiments of the method for analyzing the error rate of the MLC chip, and is not discussed further in the present disclosure.

In some embodiments, there is provided a device for analyzing an error rate of an MLC chip. The device for analyzing the error rate of the MLC chip may include a computer device, and the computer device may be a terminal or a server. The internal structural diagram of the device for analyzing the error rate of the MLC chip may be shown in FIG. 4. The device for analyzing the error rate of the MLC chip includes a processor, a memory, a network interface and an inputting device that are connected by a system bus. The processor is used for providing the capacity of calculation and controlling. The memory includes a non-volatile storage medium and an internal memory. The non-volatile storage medium stores an operating system and a computer-readable instruction. The internal memory provides the environment for the running of the operating system and the computer-readable instruction in the non-volatile storage medium. The network interface of the computer device is used to communicate with an external terminal or server via a network connection. The computer-readable instruction, when executed by a processor, implements the method for analyzing the error rate of the MLC chip. The inputting device may be a touching layer covering the display screen, may also be a press key, a trackball or a touchpad provided at the housing of the computer device, and may also be an externally connected keyboard, touchpad, mouse and so on.

Figure 4:
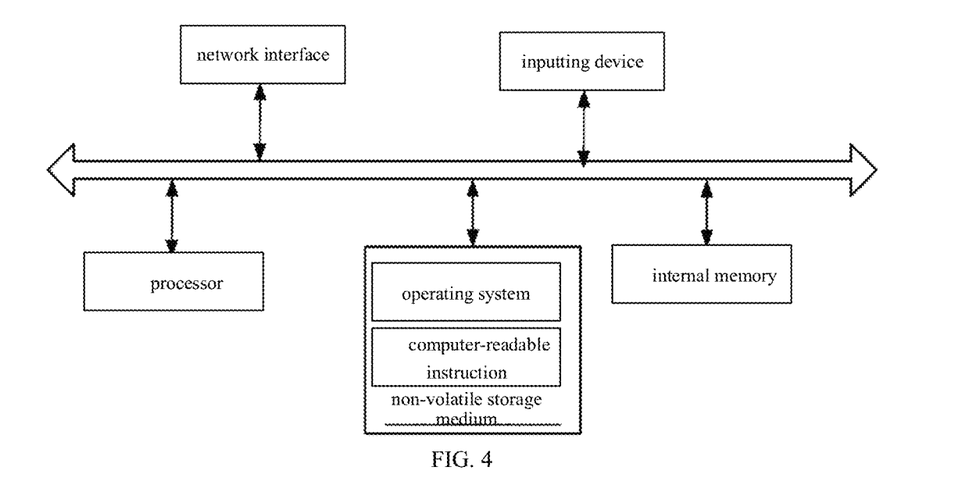
FIG. 4 is a schematic structural diagram of a device for analyzing an error rate of an MLC chip according to one or more embodiments of the present disclosure.

A person skilled in the art may understand that the structure shown in FIG. 4 is merely a block diagram of a part of the structures relevant to the solutions of the present disclosure, and does not form a limitation on the device to which the solutions of the present disclosure are applied, and the device may include components more or less than those shown in the figure or a combination of some of the components, or has a different arrangement of the components.

The present disclosure further provides a device for analyzing an error rate of an MLC chip. The device for analyzing the error rate of the MLC chip may be a computer device, and the computer device may be a terminal or a server. The device for analyzing the error rate of the MLC chip includes:

a memory configured for storing a computer-readable instruction; and one or more processors configured for executing the computer-readable instruction stored by the memory, wherein the computer-readable instruction, when executed by the processors, may implement the steps of the method for analyzing the error rate of the MLC chip according to any one of the above embodiments.

The description on the device for analyzing the error rate of the MLC chip according to the present disclosure may refer to the above embodiments of the method for analyzing the error rate of the MLC chip, and is not discussed further in the present disclosure.

An embodiment of the present disclosure further provides a non-volatile readable storage medium, wherein the non-volatile readable storage medium stores a computer-readable instruction, and the computer-readable instruction, when executed by one or more processors, may implement the steps of the method for analyzing the error rate of the MLC chip according to any one of the above embodiments.

It should also be noted that, in the description, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "including a . . . " does not exclude additional same element in the process, method, article or device including the element.

A person skilled in the art may understand that all or some of the processes of the methods according to the above embodiments may be implemented by relative hardware according to an instruction from a computer-readable instruction, the computer-readable instruction may be stored in a non-volatile computer-readable storage medium, and the computer-readable instruction, when executed, may contain the processes of the embodiments of the method stated above. Any reference to a memory, a storage, a database or another medium used in the embodiments of the present disclosure may include a non-volatile and/or volatile memory. The non-volatile memory may include a read-only memory (ROM), a programmable ROM (PROM), an electrically programmable ROM (EPROM), an electrically erasable programmable ROM (EEPROM) or a flash memory. The volatile memory may include a random access memory (RAM) or an external cache memory. By way of explanation rather than limitation, the RAM may be embodied in various forms, such as a static RAM (SRAM), a dynamic RAM (DRAM), a synchronous DRAM (SDRAM), a double-data-rate SDRAM (DDRSDRAM), an enhanced SDRAM (ESDRAM), a Synchlink DRAM (SLDRAM), a Rambus direct RAM (RDRAM), a direct-memory-bus dynamic RAM (DRDRAM), a memory-bus dynamic RAM (RDRAM) and so on.

The technical features of the above embodiments may be combined randomly. In order to simplify the description, all of the feasible combinations of the technical features of the above embodiments are not described. However, as long as the combinations of those technical features are not contradictory, they should be considered as falling within the scope of the description.

The above embodiments merely describe some embodiments of the present disclosure, and although they are described and in detail, they cannot be accordingly understood as limiting the patent scope of the present disclosure. It should be noted that a person skilled in the art may make variations and improvements without departing from the concept of the present disclosure, all of which fall within the protection scope of the present disclosure. Therefore, the patent protection scope of the present disclosure should be subject to the appended claims.

The invention claimed is:

1. A method for analyzing an error rate of an MLC chip, comprising:

selecting data blocks of a preset quantity from the MLC chip, and performing erasing-writing operations of a preset time quantity to the data blocks, wherein, in the data blocks, data written into a first page that is for storing a higher bit of a dual-bit are the same, and data written into a second page that is for storing a lower bit of the dual-bit are the same;

after the erasing-writing operations are completed, reading each of groups of the dual-bits corresponding to each of the first pages and the second pages of the data blocks, and determining a bit state of the each of groups of the dual-bits, wherein the bit state comprises one first bit state that represents that data writing is correct and three second bit states that represent that the data writing is erroneous;

counting up a first total quantity of all of the dual-bits corresponding to a target page in a target bit state, and dividing the first total quantity by a total quantity of the dual-bits corresponding to the target page, to obtain a first error rate of the target page in the target bit state, wherein the target page is any one of the first pages or any one of the second pages, and the target bit state is any one of the second bit states; and counting up a second total quantity of all of the dual-bits corresponding to the data blocks in the target bit state, and dividing the second total quantity by a total quantity of the dual-bits corresponding to the data blocks, to obtain a second error rate of the data blocks in the target bit state, to analyze a performance of the MLC chip based on the first error rate and the second error rate.

2. The method for analyzing the error rate of the MLC chip according to claim 1, wherein simultaneously with the step of counting up the first total quantity of all of the dual-bits corresponding to the target page in the target bit state, the method for analyzing the error rate of the MLC chip further comprises:

counting up a third total quantity of all of the dual-bits corresponding to the target page in the first bit state, and dividing the third total quantity by the total quantity of the dual-bits corresponding to the target page, to obtain a first correction rate of the target page in the first bit state.

3. The method for analyzing the error rate of the MLC chip according to claim 2, wherein simultaneously with the step of counting up the second total quantity of all of the dual-bits corresponding to the data blocks in the target bit state, the method for analyzing the error rate of the MLC chip further comprises:

counting up a fourth total quantity of all of the dual-bits corresponding to the data blocks in the first bit state, and dividing the fourth total quantity by the total quantity of the dual-bits corresponding to the data blocks, to obtain a second correction rate of the data blocks in the first bit state.

4. The method for analyzing the error rate of the MLC chip according to claim 1, wherein the step of selecting the data blocks of the preset quantity from the MLC chip comprises:

numbering the data blocks of the MLC chip sequentially according to a storing sequence; and selecting fault-free data blocks from the data blocks, and selecting, from the fault-free data blocks, data blocks of odd-number numbers and data blocks of even-number numbers of equal quantities to be used as data blocks for analyzing the error rate.

5. The method for analyzing the error rate of the MLC chip according to claim 1, wherein the step of performing the erasing-writing operations of the preset time quantity to the data blocks comprises:

performing a data erasing operation to the data blocks, wherein all of states of all of pages in the data blocks after being erased are 11;

performing a data writing operation to the data blocks, wherein all of bit data written into the first pages of the data blocks are 1, and all of bit data written into the second pages are 0; and after the data writing operation is completed, returning to execute the step of performing the data erasing operation to the data blocks, till a total time quantity of the erasing-writing operations of the data blocks reaches the preset time quantity.

6. The method for analyzing the error rate of the MLC chip according to claim 1, wherein the step of counting up the first total quantity of all of the dual-bits corresponding to the target page in the target bit state comprises:

according to $$pageL_{2j} = \sum_{t1=1}^{total\ page\ bit\ quantity} L_{2j}^{t1},$$

counting up the first total quantity of all of the dual-bits corresponding to the target page in the target bit state;

wherein the bit state comprises the three second bit states $L_0$, $L_1$ and $L_3$ and the first bit state $L_2$; $L_{2j}=1$ represents that the bit state changes from $L_2$ into $L_j$, $L_{2j}=0$ represents that the bit state does not change from $L_2$ into $L$, and j=0, 1, and 3; $L_{2j}^{t1}$ presents a numerical value of $L_{2j}$ corresponding to a t1-th dual-bit corresponding to the target page, wherein a maximum value of t1 is a total quantity of the dual-bits corresponding to the target page; and page $L_{2j}$ is a first total quantity of all of the dual-bits corresponding to the target page in the bit state $L_j$.

7. The method for analyzing the error rate of the MLC chip according to claim 6, wherein the step of counting up the second total quantity of all of the dual-bits corresponding to the data blocks in the target bit state comprises:

according to $$blockL_{2j} = \sum_{t2=1}^{first\ or\ second\ total\ page\ quantity} pageL_{2j}^{t2},$$

counting up the second total quantity of all of the dual-bits corresponding to the data blocks in the target bit state;

wherein page $L_{2j}^{t2}$ represents a first total quantity corresponding to a t2-th first page or second page of the data blocks, wherein a maximum value of t2 is a total quantity of the first pages or a total quantity of the second pages of the data blocks; and block $L_{2j}$ is a second total quantity of all of the dual-bits corresponding to the data blocks in the bit state $L_j$.

8. The method for analyzing the error rate of the MLC chip according to claim 1, wherein each of the data blocks comprises 2*N pages, the 2*N pages are divided into N pairs of pages, and each of the pairs of pages comprises the first page for storing the higher bit of the dual-bit and the second page for storing the lower bit of the dual-bit; the data written into all of the first pages of the data blocks are the same, and the data written into all of the second pages are the same; and N is an integer greater than 1.

9. The method for analyzing the error rate of the MLC chip according to claim 1, wherein after the erasing-writing operations are completed, reading each of groups of the dual-bits corresponding to each of the first pages and the second pages of the data blocks comprises:

reading the higher bit of the dual-bit from the first page of each of the data block, and reading the lower bit of the dual-bit from the second page of each of the data block.

10. The method for analyzing the error rate of the MLC chip according to claim 1, wherein the target page refers to any one of the first pages or any one of the second pages, and a quantity of the first pages and a quantity of the second pages in a same one data block are equal.

11. A device for analyzing the error rate of the MLC chip, wherein the device comprises a memory and one or more processors, and the memory stores a computer-readable instruction, and the computer-readable instruction, when executed by the one or more processors, causes the one or more processors to implement the steps of the method according to claims 1.

12. The device for analyzing the error rate of the MLC chip according to claim 11, wherein simultaneously with the step of counting up the first total quantity of all of the dual-bits corresponding to the target page in the target bit state, the method for analyzing the error rate of the MLC chip further comprises:

counting up a third total quantity of all of the dual-bits corresponding to the target page in the first bit state, and dividing the third total quantity by the total quantity of the dual-bits corresponding to the target page, to obtain a first correction rate of the target page in the first bit state.

13. The device for analyzing the error rate of the MLC chip according to claim 12, wherein simultaneously with the step of counting up the second total quantity of all of the dual-bits corresponding to the data blocks in the target bit state, the method for analyzing the error rate of the MLC chip further comprises:

counting up a fourth total quantity of all of the dual-bits corresponding to the data blocks in the first bit state, and dividing the fourth total quantity by the total quantity of the dual-bits corresponding to the data blocks, to obtain a second correction rate of the data blocks in the first bit state.

14. The device for analyzing the error rate of the MLC chip according to claim 11, wherein the step of selecting the data blocks of the preset quantity from the MLC chip comprises:

numbering the data blocks of the MLC chip sequentially according to a storing sequence; and selecting fault-free data blocks from the data blocks, and selecting, from the fault-free data blocks, data blocks of odd-number numbers and data blocks of even-number numbers of equal quantities to be used as data blocks for analyzing the error rate.

15. The device for analyzing the error rate of the MLC chip according to claim 11, wherein the step of performing the erasing-writing operations of the preset time quantity to the data blocks comprises:

performing a data erasing operation to the data blocks, wherein all of states of all of pages in the data blocks after being erased are 11;

performing a data writing operation to the data blocks, wherein all of bit data written into the first pages of the data blocks are 1, and all of bit data written into the second pages are 0; and after the data writing operation is completed, returning to execute the step of performing the data erasing operation to the data blocks, till a total time quantity of the erasing-writing operations of the data blocks reaches the preset time quantity.

16. The device for analyzing the error rate of the MLC chip according to claim 11, wherein the step of counting up the first total quantity of all of the dual-bits corresponding to the target page in the target bit state comprises:

according to $$pageL_{2j} = \sum_{t1=1}^{total\ page\ bit\ quantity} L_{2j}^{t1},$$

counting up the first total quantity of all of the dual-bits corresponding to the target page in the target bit state;

wherein the bit state comprises the three second bit states $L_0$, $L_1$ and $L_3$ and the first bit state $L_2$; $L_{2j}=1$ represents that the bit state changes from $L_2$ into $L_j$, $L_{2j}=0$ represents that the bit state does not change from $L_2$ into $L_j$, and j=0, 1, and 3; $L_{2j}^{t1}$ represents a numerical value of $L_{2j}$ corresponding to a t1-th dual-bit corresponding to the target page, wherein a maximum value of t1 is a total quantity of the dual-bits corresponding to the target page; and $pageL_{2j}$ is a first total quantity of all of the dual-bits corresponding to the target page in the bit state $L_j$.

17. The device for analyzing the error rate of the MLC chip according to claim 16, wherein the step of counting up the second total quantity of all of the dual-bits corresponding to the data blocks in the target bit state comprises:

according to $$blockL_{2j} = \sum_{t2=1}^{first\ or\ second\ total\ page\ quantity} pageL_{2j}^{t2},$$

counting up the second total quantity of all of the dual-bits corresponding to the data blocks in the target bit state;

wherein $pageL_{2j}^{t2}$ represents a first total quantity corresponding to a t2-th first page or second page of the data blocks, wherein a maximum value of t2 is a total quantity of the first pages or a total quantity of the second pages of the data blocks; and $blockL_2$ is a second total quantity of all of the dual-bits corresponding to the data blocks in the bit state $L_j$.

18. The device for analyzing the error rate of the MLC chip according to claim 11, wherein each of the data blocks comprises 2*N pages, the 2*N pages are divided into N pairs of pages, and each of the pairs of pages comprises the first page for storing the higher bit of the dual-bit and the second page for storing the lower bit of the dual-bit; the data written into all of the first pages of the data blocks are the same, and the data written into all of the second pages are the same; and N is an integer greater than 1.

19. One or more non-volatile computer-readable storage mediums storing a computer-readable instruction, wherein the computer-readable instruction, when executed by one or more processors, causes the one or more processors to implement the steps of the method according to claims 1.

20. The one or more non-volatile computer-readable storage mediums according to claim 19, wherein simultaneously with the step of counting up the first total quantity of all of the dual-bits corresponding to the target page in the target bit state, the method for analyzing the error rate of the MLC chip further comprises:

counting up a third total quantity of all of the dual-bits corresponding to the target page in the first bit state, and dividing the third total quantity by the total quantity of the dual-bits corresponding to the target page, to obtain a first correction rate of the target page in the first bit state.

* * * * *